United States Patent
Lee et al.

(10) Patent No.: US 6,670,275 B2
(45) Date of Patent: Dec. 30, 2003

(54) METHOD OF ROUNDING A TOPCORNER OF TRENCH

(75) Inventors: Chun-Hung Lee, Chungli (TW); Shiuh-Sheng Yu, Chi-Lung (TW); Chia-Chi Chung, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 0 days.

(21) Appl. No.: 10/158,039

(22) Filed: May 29, 2002

(65) Prior Publication Data

US 2003/0224609 A1 Dec. 4, 2003

(51) Int. Cl.[7] ............................................. H01L 21/311
(52) U.S. Cl. ................................................... 438/700
(58) Field of Search ................... 438/700, 706, 438/710, 723, 724

(56) References Cited

U.S. PATENT DOCUMENTS 6,527,968 B1 * 3/2003 Wang et al. ............... 216/67

* cited by examiner

*Primary Examiner*—Hoai Ho
*Assistant Examiner*—Quoc Dinh Hoang

(57) ABSTRACT

A method for pulling back SiN to increase rounding effect in a shallow trench isolation process, includes the steps of preparing a substrate of Si and forming a $SiO_2$ layer on the substrate, forming a $Si_3N_4$ layer on the $SiO_2$ layer, defining $Si_3N_4$ trenches by plasma etching, etching the remaining $Si_3N_4$ with $SF_6/HB_r$ gas, etching $SiO_2$ layer to form a platform and enhance the rounding of the platform, etching the substrate to have a third shallow trench and a reinforced platform, filling the third shallow trench with oxide, planarizing the filled oxide using chemical mechanical polishing, and removing the $Si_3N_4$ layer, wherein after the removal of the $Si_3N_4$ layer, multiple cleaning processes are performed.

2 Claims, 3 Drawing Sheets

(E)

METHOD OF ROUNDING A TOPCORNER OF TRENCH

FIELD OF THE INVENTION

The present invention relates to a method for increasing rounding effect in a trench top corner, and more particularly to a method for pulling back SiN to increase rounding effect in a shallow trench isolation process (STI) and to avoid Wrap Round in the trench top corner.

BACKGROUND OF THE INVENTION

Trench isolation is a widely used method in the modern VLSI process to isolate elements. The primary principle of the technique is to use the anisotropic dry etch to define a trench and then a filling is added to the trench. As the trend of the modern semiconductor, the dimension of the elements used in the semiconductor is smaller and smaller, which causes the dimension of the isolation layer to decrease. Accordingly, semiconductors having the structure of STI become the mainstream.

With reference to FIGS. 1A to 1H, the conventional STI technique includes the following steps. First, a $SiO_2$ layer 102 is formed on a substrate 101 of Si. A $Si_3N_4$ layer 103 is deposited on the $SiO_2$ layer 102 to form a shallow trench area 104. Then, high density plasma chemical vapor deposition is used to precipitate an oxide 105 in the shallow trench area 104. After the precipitation step, it is necessary to planarize the oxide 105. A step of rounding the shallow trench corner 104a is then processed. After the rounding process, the $Si_3N_4$ layer 103 is removed. Finally, cleaning steps including wet cleaning, cell cleaning and tunnel cleaning are performed.

In the conventional method, the oxide 105 is planarized in an etcher and then cleaned. After the post cleaning process, an oxide recessed portion 106 is often formed on the edge of the oxide 105 in the shallow trench area 104. The recessed portion 106 causes a wafer to have abnormal conductivity, such as double humps in the $I_d$-$V_G$ curve.

Therefore, it is necessary to provide an improved method to form a shallow trench isolation structure to eliminate the wrap around in the trench top corner.

To overcome the aforementioned problem, some introduces a method, as shown in the prior art and in FIGS. 2A to 2I, to protect the edges of the wafer, which includes the following steps. The first step is to prepare a $SiO_2$ layer 202 and a $Si_3N_4$ layer 203 on a substrate 201 of Si. Then, a photoresist layer 204 that defines an opening 205 is formed above the $Si_3N_4$ layer 203. An anisotropic etching is applied to the $SiO_2$ layer 202 and the $Si_3N_4$ layer 203 to form an encasing wall 206a around the photoresist layer 204, the $SiO_2$ layer 202, the $Si_3N_4$ layer 203 and the opening 205. Thereafter, a dry etching is introduced to the encasing wall 206b that encloses the opening 205 and the substrate 201 to form a shallow trench area 207. Then, the photoresist layer 204 and the encasing wall 206b are removed to expose the unetched area on the substrate 201 and a sharp edge 208a. After the removal of the photoresist layer, it is then required to form an oxide of Si 209 on the unetched area of the substrate 201 and the sharp edge 208a to change the sharp edge 208a to round edge 208b. Then it is necessary to precipitate an insulation layer 210 on the oxide of Si 209 and fill the shallow trench area 207. Last, the $SiO_2$ layer 202 and the $Si_3N_4$ layer 203 are removed from the insulation layer.

This method uses the encasing wall 206b of a polymer to fill in the opening 205. When the polymer is removed and the insulation layer 210 is filled in the space left by the removal of the polymer, the insulation layer 210 is able to protect the corner 211.

This method does meet the necessary requirements. However, it needs the step of forming the encasing wall and the removal of the encasing wall, it is too complicated and the cost of manufacturing is increased.

According to the foregoing technique, the methods such as wet etch or oxidation to pull back the SiN complicates the process and increases the cost. Furthermore, after the $Si_3N_4$ layer is removed, the post cleaning process easily forms wrap round on the trench top corner and thus causes high electric field and pre-breakdown.

To overcome the shortcomings, the present invention intends to provide an improved method for pulling back $S_iN$ to increase rounding effect in a shallow trench isolation process and to avoid Wrap Round in the trench top corner.

SUMMARY OF THE INVENTION

The primary objective of the present invention is to provide a method for pulling back SiN to increase rounding effect in a shallow trench isolation process and to avoid Wrap Round in the trench top corner.

To order to accomplish the foregoing objective, the method adds an isotropic etching process to pull back the $Si_3N_4$ and to increase the trench top corner rounding. After the SiN layer is etched to a predetermined depth, a gas of $SF_6/HB_r$ is applied to fully etch the remaining SiN. With the gradient variation of the depth by the $SF_6/HB_r$, and the etch rate selectivity of $SiO_2$ to Si being less than 1, a top rounding etch step is adopted to continue etching the oxide layer and the substrate to have a reinforced top corner rounding.

Other objects, advantage and novel features of the invention will become more apparent from the following detailed description when taken in conjunction with the accompanying drawings.

DETAILED DESCRIPTION OF THE INVENTION

With reference to FIGS. 3A to 3I, a method of the present invention using an isotropic etching process to pull back the $Si_3N_4$ and to increase the trench top corner rounding is shown.

Figure 1:
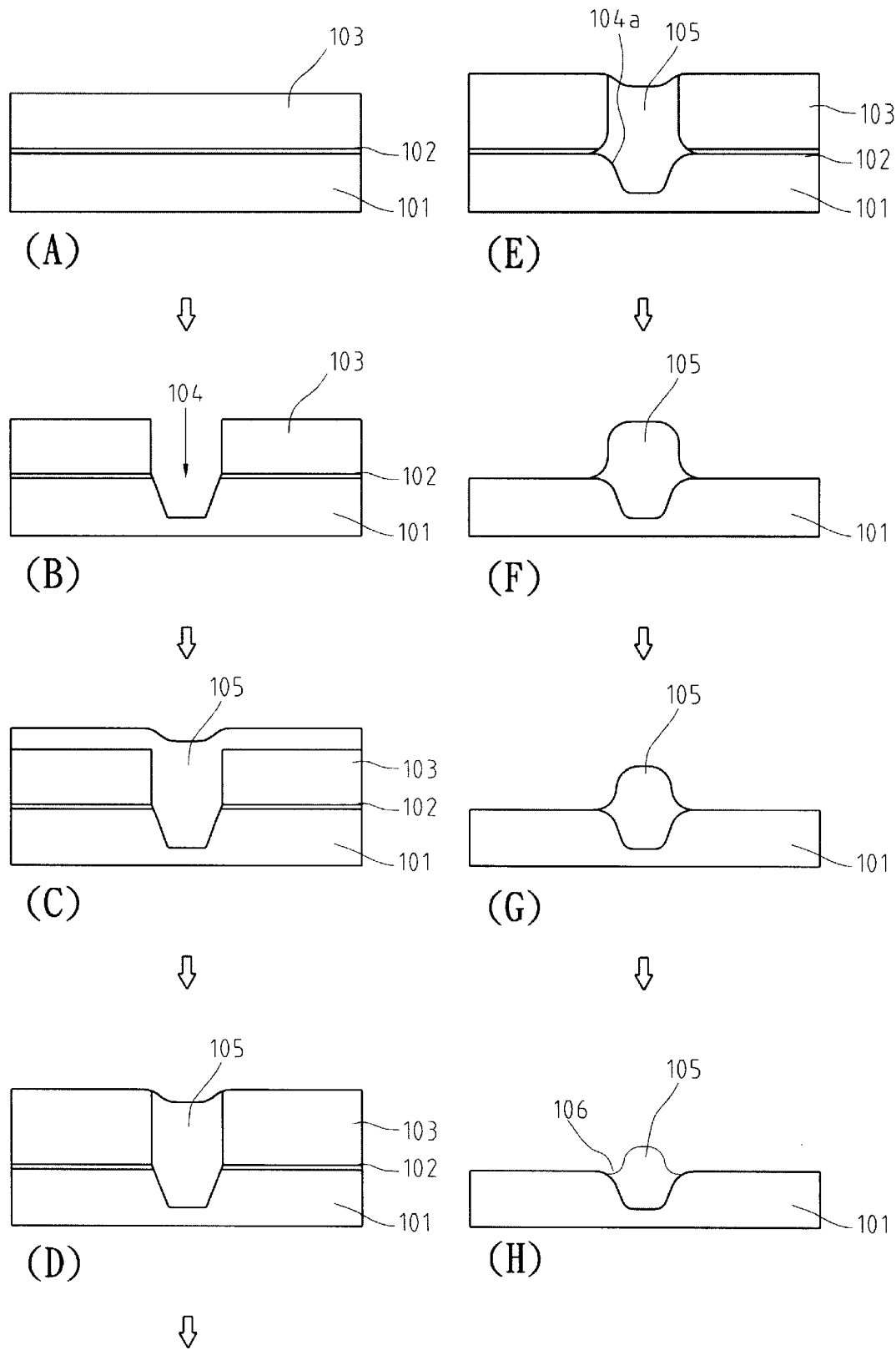
FIGS. 1A to 1H are schematic views of a conventional method used in the STI.
Figure 2:
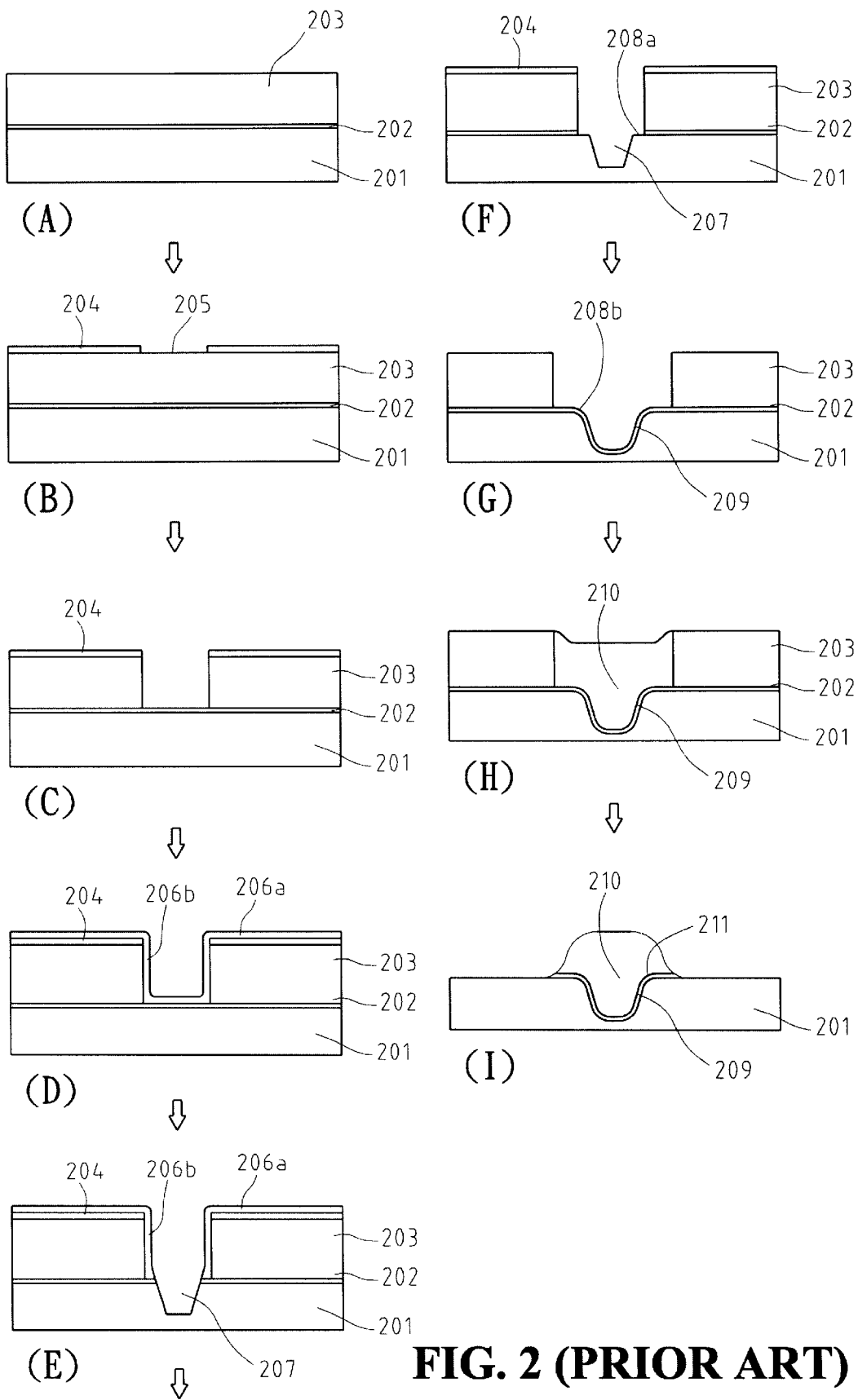
FIGS. 2A to 2I are schematic views of another conventional method in the STI, wherein an oxide recessed portions will be formed on the edge of the oxide in the shallow trench area and the wafer to cause abnormal conductivity.
Figure 3:
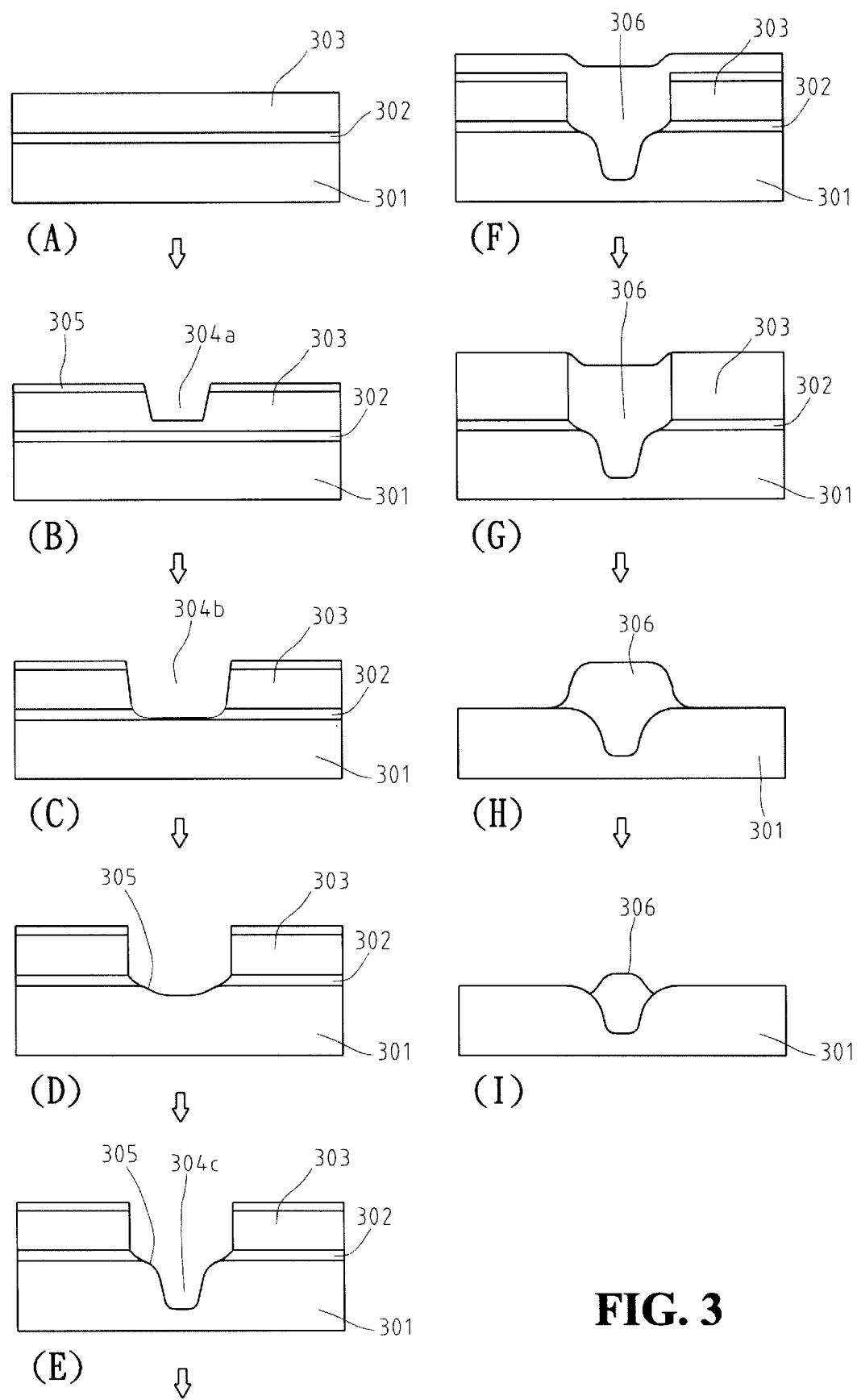
FIGS. 3A to 3I are schematic views of the method of the invention, wherein an isotropic etching process is used to pull back the $Si_3N_4$ and to increase the trench top corner rounding.

The method comprises the following steps. The first step is to prepare a substrate of Si 301 and a $SiO_2$ layer 302 is then formed on the substrate 301. Thereafter, a $Si_3N_4$ layer 303 is formed on the $SiO_2$ layer 302. Then, it is necessary to define shallow trenches 304a by etching, which applies a photoresist layer 305 on the $Si_3N_4$ layer 303 and the $Si_3N_4$ layer 303 is partially etched with plasma etcher to form a first-stage trench 304a as shown in FIG. 3(B). The next step is to etch the remaining $Si_3N_4$ layer 303 with $SF_6/HB_r$ gas using plasma etching process. The plasma etch may be processed at a same process chamber (in-situ) or in another etcher (ex-situ). Because the $SF_6/HB_r$ gas used in the plasma etch has high etching selectivity of $Si_3N_4$ to oxide, during the $SF_6/HB_r$ gas soft landing on the $SiO_2$ 302 layer, the $SF_6/HB_r$ gas pushes the $Si_3N_4$ layer 303 backward and etches $S_iO_2$ layer 302 to form a second-stage trench 304b with depth gradient as shown in FIG. 3(C). The following step is to form a rounded platform 305 as shown in FIG. 3(D) by using $CH_4/HB_r$, $CF_4/CH_2F_2$, $CF_4/CHF_3$, $CH_2F_2$ or $CHF_3$ to continue etching $SiO_2$ layer 302 and part of the substrate for 300~500 Å so as to enhance the rounding of the platform 305. Then, it is required to etch the substrate 301 to have a shallow trench 304c as shown in FIG. 3(E) at a depth of about 5000 Å with rounded corners formed by the platform 305. The shallow trench 304c is filled with oxide 306. After the filling step, it is necessary to planarize the oxide 306 by chemical mechanical polishing. Finally, the $Si_3N_4$ layer 303 is removed. After the removal of the $Si_3N_4$ layer 303, multiple cleaning processes are performed to clean the wafer.

In the dry etching step of the present invention, it may be applied at poly etcher with in-situ $Si_3N_4$ open and has the least time and least cost to complete the process when compared with the foregoing conventional method. The method is able to make a rounded silicon platform 305 after the shallow trench isolation process is finished to avoid wrap round. Especially, with or without the rounding step, the method of the invention can still protect the STI corner to avoid abnormal conductivity. Therefore, when the post trench isolation is finished, wrap round at the STI corner is avoided.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of rounding a top corner of a trench in a shallow trench isolation process, comprising the steps of:

preparing a substrate of Si and forming a $SiO_2$ layer on the substrate;

forming a $Si_3N_4$ layer on the $SiO_2$ layer;

partially etching the $Si_3N_4$ layer using plasma etching process to form a first-stage trench;

etching the remaining $Si_3N_4$ layer and a portion of $SiO_2$ layer under the first-stage trench with $SF_6/HB_r$ gas to form a second-stage trench with depth gradient;

etching the remaining $SiO_2$ layer and a portion of the substrate under the second-stage trench to form a rounded platform for the second-stage trench; and etching the substrate under the rounded platform of the second-stage trench to form a completed shallow trench having a rounded top corner;

wherein a gas used to etch the remaining $SiO_2$ layer under the second-stage trench is selected from the group consisting of $CH_4/HB_r$, $CF_4/CH_2F_2$, $CF_4/CHF_3$, $CH_2F_2$ and $CHF_3$.

2. The method as claimed in claim 1, wherein the portion of the substrate etched to form the rounded platform for the second-stage trench is about 300 to 500 Å.

* * * * *